US007416786B2

(12) United States Patent
Oda et al.

(10) Patent No.: US 7,416,786 B2
(45) Date of Patent: Aug. 26, 2008

(54) AMORPHOUS CARBON FILM, PROCESS FOR PRODUCING THE SAME AND AMORPHOUS CARBON FILM-COATED MATERIAL

(75) Inventors: Kazuhiko Oda, Itami (JP); Yoshiharu Utsumi, Itami (JP); Hisanori Ohara, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 176 days.

(21) Appl. No.: 10/539,649

(22) PCT Filed: Feb. 26, 2003

(86) PCT No.: PCT/JP03/02110

§ 371 (c)(1),
(2), (4) Date: Jun. 15, 2005

(87) PCT Pub. No.: WO2004/076710

PCT Pub. Date: Sep. 10, 2004

(65) Prior Publication Data

US 2006/0246290 A1    Nov. 2, 2006

(51) Int. Cl.
*B32B 9/00* (2006.01)

(52) U.S. Cl. .................. 428/408; 428/212; 428/217; 428/336; 428/469

(58) Field of Classification Search ................. 428/408, 428/212, 336, 469, 217; 204/192
See application file for complete search history.

(56) References Cited

U.S. PATENT DOCUMENTS

| 5,202,156 | A | 4/1993 | Yamamoto et al. | |
| 6,087,025 | A * | 7/2000 | Dearnaley et al. | 428/698 |
| 6,180,263 | B1 * | 1/2001 | Naoi | 428/634 |
| 6,284,376 | B1 * | 9/2001 | Takenouchi et al. | 428/408 |
| 6,740,393 | B1 * | 5/2004 | Massler et al. | 428/472 |
| 6,904,935 | B2 * | 6/2005 | Welty et al. | 137/625.17 |
| 2001/0024737 | A1 | 9/2001 | Utsumi et al. | |

FOREIGN PATENT DOCUMENTS

| EP | 1 266 879 | * | 12/2002 |
| EP | 1 380 667 | A1 | 1/2004 |
| JP | 56-041372 | B2 | 4/1981 |
| JP | 62-116767 | B2 | 5/1987 |
| JP | 63-004068 | B2 | 1/1988 |
| JP | 63-262467 | B2 | 10/1988 |
| JP | 02022458 | | 1/1990 |
| JP | 03-158455 | A | 7/1991 |
| JP | 07215795 | | 8/1995 |
| JP | 08-232067 | A | 9/1996 |
| JP | 08-283931 | A | 10/1996 |
| JP | 09-128708 | A | 5/1997 |
| JP | 11-049506 | A | 2/1999 |
| JP | 2000-080473 | A | 3/2000 |
| JP | 2000-087218 | A | 3/2000 |
| JP | 2000-128516 | A | 5/2000 |
| JP | 2001-192206 | A | 7/2001 |
| JP | 2001192864 | | 7/2001 |
| JP | 2002008217 | | 1/2002 |
| JP | 2002322555 | | 11/2002 |
| JP | 2003-027214 | A | 1/2003 |
| JP | 2003-073808 | A | 3/2003 |
| JP | 2003-147508 | A | 5/2003 |

OTHER PUBLICATIONS

Patent Abstracts of Japan for JP2003-027214 published Jan. 29, 2003.
"Tribological Characteristics of Diamond-Like Carbon Coatings" by K. Holmberg, H. Ronkainen et al., PB Rep, Mar. 23, 1994, p. 24-38.
Patent Abstracts of Japan for JP2000-128516 published May 9, 2000.
Patent Abstracts of Japan for JP2003-147508 published May 21, 2003.
Patent Abstracts of Japan for JP2003-073808 published Mar. 12, 2003.
Patent Abstracts of Japan for JP2001-192206 published Jul. 17, 2001.
Patent Abstracts of Japan for JP08-283931 published Oct. 29, 1996.
Patent Abstracts of Japan for JP63-004068 published Jan. 9, 1988.
Patent Abstracts of Japan for JP03-158455 published Jul. 8, 1991.
Patent Abstracts of Japan for JP09-128708 published May 16, 1997.
Patent Abstracts of Japan for JP2000-080473 published Mar. 21, 2000.
Patent Abstracts of Japan for JP56-041372 published Apr. 18, 1981.
Patent Abstracts of Japan for JP62-116767 published May 28, 1987.
Patent Abstracts of Japan for JP63-262467 published Oct. 28, 1988.
Patent Abstracts of Japan for JP08-232067 published Sep. 10, 1996.
Patent Abstracts of Japan for JP11-049506 published Feb. 23, 1999.
Patent Abstracts of Japan for JP2000-087218 published Mar. 28, 2000.
International Search Report for PCT/JP2003/002110, mailed Jul. 15, 2003.
Jung et al., "The Investigation of Thermal Effect on the Properties of Pulsed Laser Deposited Diamond-Like Carbon Films," *Thin Solid Films*, 332:103-108, 1998.
Office Action in co-pending Japanese Application No. 2001-342218, issued by Japanese Patent Office, Aug. 14, 2007, English translation of document.
Li, et al., 2000. "Experimental Study of Hydrogen-free DLC film Deposition by XeCl(308nm) pulsed laser ablation". Proc. SPIE Int. Soc. Opt. Eng. 3885: 323-330.
Diaz, et al., 1992. "Raman spectroscopy of carbon films grown by pulsed laser evaporation of graphite". Diamond and Related Materials 1: 824-827.

* cited by examiner

*Primary Examiner*—Archene Turner
(74) *Attorney, Agent, or Firm*—Darby & Darby P.C.

(57) ABSTRACT

An amorphous carbon film is provided with a density of 2.8-3.3 g/cm$^3$. It would be preferable for the film to have: a spin density of $1\times10^{18}$-$1\times10^{21}$ spins/cm$^3$; a carbon concentration of at least 99.5 atomic percentage; a hydrogen concentration of no more than 0.5 atomic percentage; an inert gas element concentration of no more than 0.5 atomic percentage; and a Knoop hardness of 3000-7000. A mixed layer with a thickness of at least 0.5 nm and no more than 10 nm is formed from a parent material and at least material selected from: B, Al, Ti, V, Cr, Zr, Nb, Mo, Hf, Ta, and W. An amorphous carbon film is disposed on the mixed layer or a metallic intermediate layer formed on the mixed layer, thereby increasing adhesion. This amorphous carbon film is formed with solid carbon using sputtering, cathode-arc ion plating, or laser abrasion.

11 Claims, No Drawings

AMORPHOUS CARBON FILM, PROCESS FOR PRODUCING THE SAME AND AMORPHOUS CARBON FILM-COATED MATERIAL

CROSS-REFERENCE TO PRIOR APPLICATION

This is a U.S. National Phase Application under 35 U.S.C. §371 of International Patent Application No. PCT/JP2003/002110 filed Feb. 26, 2003 which is incorporated by reference herein. The International Application was published in Japanese on Sep. 10, 2004 as WO 2004/076710 A1 under PCT Article 21 (2).

TECHNICAL FIELD

The present invention relates to amorphous carbon film of a high hardness. They are used to coat tools, dies, machine parts, electric and electronic parts, optical parts, and the like.

BACKGROUND ART

Because of their mechanical properties and chemical stability, carbon films have been used as coating material for improving wear resistance and durability of a variety of parts.

In the prior art, films comprising carbon include diamond film, graphite film, amorphous carbon film, and the like. The manufacturing method and characteristics of these are as follows.

Diamond films are generally synthesized by filament CVD method, microwave plasma CVD method, or the like. The synthesis temperature is a high temperature of 700 degrees C. or greater. This synthesis is conducted by introducing approximately 1% of a hydrocarbon gas such as methane and a large amount (approximately 99%) of hydrogen gas. The reason for introducing hydrogen gas is to generate a large amount of atomic hydrogen. The atomic hydrogen reacts with and removes the amorphous component which is synthesized in the film.

The structure of the diamond film is a cubic crystal system, and a diffraction image reflecting a diamond structure is obtained with electron beam diffraction and X ray diffraction. With Raman spectroscopy analysis, there is a narrow peak near 1333 cm$^{-1}$ corresponding to a diamond structure. Because of its crystalline quality, the film that is obtained has an extremely rough surface reflecting the crystalline structure. For its properties, it has a Knoop hardness of 9000 or greater and a density of 3.51 g/cm$^3$ or greater.

On the hand, a graphite film is achieved by a vacuum deposition method or thermal decomposition of hydrocarbon gas. With the former method, synthesis occurs at a low temperature of 500 degrees C. or less, and with the latter method, synthesis is at a high temperature of 1000 degrees C. or greater. The crystal structure of graphite is a crystal with a hexagonal crystal system. It is very soft with a Knoop hardness of 200 or less. The density is approximately 2.25 g/cm$^3$.

Amorphous carbon film is intermediate between diamond and graphite or between diamond and carbon resin.

The manufacturing method for amorphous carbon film includes plasma CVD method, ion vapor deposition method, sputter method and the like. All of these have in common a low synthesis temperature of 400 degrees C. or lower. They are generally synthesized at a temperature of approximately 200 degrees C. or less. In plasma CVD method or ion vapor deposition method, hydrocarbon gas is the raw material. In order to control the film quality, hydrogen gas is often added. In the sputter method, a rare gas such as argon is used for sputtering, and for control of film quality, hydrogen or hydrocarbon gas is generally added. Its structure, composition, and properties are as follows.

Its structure is amorphous and is thought to be a mixture of an sp3 structure reflecting a diamond structure, an sp2 structure reflecting a graphite structure, and bonding with hydrogen, and the like. With electron beam diffraction and X ray diffraction, a halo pattern reflecting the amorphous structure is obtained. Raman spectroscopy analysis shows a structure having a wide peak and shoulder near 1300-1600 cm$^{-1}$ region. Because it is amorphous, the resulting film is smooth.

Amorphous carbon films typically contain 10-50 at % hydrogen. In Japanese Examined Patent Publication 5-58068, for example, there is one in which hydrogen content is 20-30 at %. Furthermore, in order to increase hardness, there have been proposals for decreasing hydrogen content to around several to 10 at %. In Japanese Laid-Open Patent Publication Number 3-158455 and Japanese Laid-Open Patent Publication Number 9-128708, there are disclosures of ones with hydrogen contents of several at %. Other than hydrogen, the addition of various elements has been attempted. There have been reports of examples in which metal, nitrogen, halogen atoms, and the like are added. In addition, with sputter methods in which solid carbon is used as a raw material, because film formation is conducted under a rare gas atmosphere of argon or the like, rare gas becomes incorporated in the film. Furthermore, in Japanese Laid-Open Patent Number 2000-80473, rare gas elements are aggressively incorporated in order to control internal stress, hardness, wear resistance, and the like.

With regard to the properties of amorphous carbon films, there is a wide range with a Knoop hardness of 1000-2000 and a density of 1.5-2.5 g/cm$^3$. For example in Japanese Laid-Open Patent Publication Number 9-128708, one with a density of 1.5-2.2 g/cm$^3$ has been shown.

In recent years, a variety of surface treatments have been used for tools, dies, machine parts, and the like. In order to achieve adhesion of the coating, various methods have been used. A typical method is one in which adhesion is improved by introducing an interlayer which has a high affinity to both the substrate and the coating. However, with a coating of an amorphous carbon film as described previously, adhesion is particularly difficult to achieve, and the following method has been proposed.

For example, in Japanese Patent Number 1444896, between vapor-deposited carbon and the substrate, there is an interlayer of a carbide, nitride, oxide, boride, or the like of a group 4a, 5a, or 6a metal of the periodic table.

In addition, in Japanese Patent Number 1940883, between a carbon hard film and a base metal, there is an interlayer having two layers with the lower layer being mainly Cr, Ti, and the upper layer being mainly Si or Ge. By further layering the interlayer, the first interlayer which is the lower layer has affinity with the substrate and the second interlayer which is the upper layer has affinity with the carbon film.

In Japanese Patent Number 2628595, there is a diamond carbon covering with an interlayer of a metal or alloy of Co, Cr, Ni, or the like. The recommended film thickness of the interlayer has a wide range of 10 nm-100 micrometers.

In Japanese Laid-Open Patent Number 8-232067, there is proposed a method of providing one or more layers of an interlayer which has a toughness greater than that of the hard carbon.

In addition, in Japanese Laid-Open Patent Number 11-49506, there is proposed a method for covering a substrate with a hard carbon film via an interlayer which contains a carbide of a metal of the substrate. By incorporating a component of the substrate in the interlayer, the affinity with the substrate is increased, and at the same time, by having a carbide as the interlayer, there is affinity with the carbon film.

Furthermore, in Japanese Laid Open Patent Publication Number 2000-87218, there is proposed a structure in which at the interface between an amorphous carbon film and a substrate, there is a mixed layer of thickness 10-500 angstroms containing a substrate-constituting element and an amorphous carbon film-constituting element, or else an interlayer of thickness 10-1000 angstroms is formed on the substrate surface, and between the interlayer and the amorphous carbon film, there is a mixed layer of thickness 10-500 angstroms containing an interlayer-constituting element and an amorphous carbon film-constituting element.

When amorphous carbon films are used in tools, dies, and machine parts, there are the following problems. In other words, hardness is inadequate, heat resistance is low, and adhesion is low.

As described above, amorphous carbon films generally have a Knoop hardness of approximately 1000-2000. In contrast with a diamond which has a Knoop hardness of approximately 9000 or greater, this is approximately ⅟10 to ⅕ of the hardness. Especially when wear resistance is needed, materials with a higher hardness is desired. Although patents have disclosed ones with hardness of 2000 or greater, there have not been many amorphous carbon films with a hardness of 2000 or greater that have been put into practical use. This is thought to be because there is still the problem of adhesion which will be described later. Heat resistance of amorphous carbon film in atmospheric air is generally in the range of 350 to 450 degrees C. With higher temperatures, the hydrogen in the film is removed, oxidation proceeds, and hardness is dramatically reduced. Therefore, these amorphous carbon films can not be used in tools, dies, or machine parts with a high usage temperature.

With the biggest problem of adhesion, various methods as described previously have been used. However, even so, an adequate adhesion of amorphous carbon film is not achieved. The reason for this is thought to be as follows.

Firstly, when a carbide interlayer is used, there is difficulty in having a stable carbon concentration. With a slight change in synthesis conditions, adhesion with the substrate or lower layer becomes poor. The interface with the amorphous carbon film which is the upper layer also can readily become unstable. Film formation must be conducted while under extremely strict control.

Furthermore, nitrides, oxides, and borides do not have a very good affinity with amorphous carbon film. Therefore, formation of another interlayer on the upper layer becomes necessary, and there is an increase in the number of layers and interfaces, and there is increased instability.

Si and Ge are interlayer materials which have a comparatively stable adhesion with respect to amorphous carbon films. However, because of its brittleness, usage for high load purposes is problematic. In addition, they do not have good affinity with many metal substrates.

In addition, amorphous carbon film is a material with extremely high internal stress. In order to have the interlayer relieve some of the stress, a material with a high toughness such as metal or the like is introduced into the interlayer to have a stress relieving layer. However, fatigue accumulates in the area of this interlayer, and with time, this may result in peeling. This is the case when using an interlayer of a metal of Co, Cr, Ni, Mo.

With the method in which a mixed layer is provided between the substrate and amorphous carbon film or between the interlayer and amorphous carbon film, because the amorphous carbon film-constituting element is irradiated with high energy, at the time of mixed layer formation, the temperature of the irradiation surface increases, and the carbon in the mixed layer becomes graphite. The carbon component which becomes graphite has dramatically lower adhesion.

Furthermore, because amorphous carbon film is processed at a relatively low temperature, an adequate bonding at the interface is not obtained just by using a combination with a high affinity. Even when the interlayer contains substrate material, it is difficult to ensure adhesion when the processing temperature is low.

With regard to the above problems, there is the thought of using a diamond film instead of an amorphous carbon film. The hardness is a Knoop hardness of 9000 or greater, and heat resistance also surpasses that of amorphous carbon. Because the film formation temperature is high at 700 degrees C. or greater, if a suitable interlayer material is chosen, adhesion should theoretically be easily achieved. However, because the film formation temperature is so high, the materials that can be used become limited. More concretely, the materials are limited to ceramics or high hardness alloys. All-purpose and inexpensive materials such as iron materials and the like can not be used. In addition, because the surface roughness is high, for many uses such as tools, dies, machine parts, and the like, a diamond film can not be used without polishing.

DISCLOSURE OF INVENTION

The object of the present invention is to improve the hardness, heat resistance, and adhesion of amorphous carbon film.

The amorphous carbon film according to an implementation of the present invention is a material different from a diamond. Diamonds are crystalline and have a Vickers hardness of approximately 9000 or greater. With electron beam diffraction and X-ray diffraction, a diamond has a diffraction image which reflects the diamond structure. From the present amorphous carbon film, a halo pattern is obtained and reflects its amorphous quality. With Raman spectroscopy, a diamond has a narrow peak at around 1333 $cm^{-1}$ corresponding to the diamond structure. With the amorphous carbon film, there are wide peaks of widths around several tens to 200 $cm^{-1}$ at around 1350 $cm^{-1}$ and at around 1550 $cm^{-1}$. The index of refraction for a diamond is around 2.4. For the amorphous carbon film, it is between 1.7 and 2.3. The synthesis temperature for a diamond is 700 degrees C. or greater and generally from 800 degrees C. to 1000 degrees C. or greater. For an amorphous carbon film, it is 450 degrees C. or lower and generally 200 degrees C. or lower. For the synthesis of a diamond, synthesis is conducted by introducing a large amount of hydrogen gas (around 99%) to around 1% of a hydrocarbon gas such as methane and the like. A large amount of atomic hydrogen is generated, and the atomic hydrogen reacts with and removes the amorphous component synthesized in the film. In the synthesis of the amorphous carbon film according to an implementation of the present invention, hydrogen gas is generally not introduced into the atmosphere. In the implementation of the present invention, the amorphous carbon film is obtained with solid carbon as the raw material. Diamonds are not obtained from solid carbon.

In this way, amorphous carbon differs greatly from diamonds in synthesis method and structure. As a result, even if the methods used for improving performance and improving density of diamonds are used for amorphous carbon film, it is generally not possible to achieve the same effects.

The present inventors propose the following to solve the above problems.

(1) An amorphous carbon film, having a density of 2.8 g/cm$^3$ or greater and 3.3 g/Cm$^3$ or less.

(2) An amorphous carbon film as described in (1), having a spin density of $1\times10^{18}$ spins/cm$^3$ or greater and $1\times10^{21}$ spins/cm$^3$ or less.

(3) An amorphous carbon film as described in (1) or (2), wherein a concentration of carbon is 99.5 at % or greater, a concentration of hydrogen is 0.5 at % or less, a concentration of a rare gas element is 0.5 at % or less.

(4) An amorphous carbon film as described in one of (1) through (3), wherein the amorphous carbon film is essentially formed only from carbon.

(5) An amorphous carbon film as described in one of (1) through (4), wherein Knoop hardness is 3000 or greater and 7000 or less.

(6) An amorphous carbon film, wherein on a base material surface, a mixed layer, which contains base material and at least one substance selected from the group consisting of B, Al, Ti, V, Cr, Zr, Nb, Mo, Hf, Ta, and W, is formed with a thickness of 0.5 nm or greater and 10 nm or less; an amorphous carbon layer is formed on top of the mixed layer.

(7) An amorphous carbon film, wherein between a base material and an amorphous carbon layer, there is an interlayer, which contains at least one substance selected from the group consisting of B, Al, Ti, V, Cr, Zr, Nb, Mo, Hf, Ta, and W and which has a thickness of 0.5 nm or greater and 10 nm or less; on a base material side of the interlayer, there is a mixed layer which contains base material and interlayer material and which has a thickness of 0.5 nm or greater and 10 nm or less.

(8). An amorphous carbon film as described in (7), wherein the mixed layer and the interlayer have a combined thickness of 10 nm or less.

(9) An amorphous carbon film as described in (6) through (8), wherein: thickness of the mixed layer is 0.5 nm or greater and 5 nm or less.

(10) An amorphous carbon film as described in (6) through (9), wherein: an average oxygen concentration contained in the mixed layer or in the mixed layer and interlayer is 1 at % or less.

(11) An amorphous carbon film, wherein with an amorphous carbon film as described in one of (1) through (5), an interface between the base material and the amorphous carbon layer is one described in one of (6) through (10).

(12) A method for manufacturing an amorphous carbon film described in (1) through (11), wherein the method for making the amorphous carbon film is a sputter method or a cathode arc ion plating method or a laser ablation method; film formation of the amorphous carbon film is conducted with solid carbon as a raw material under an atmosphere which does not contain hydrogen.

(13) A method for manufacturing an amorphous carbon film described in (1) through (11), wherein the amorphous carbon film is made by using a cathode arc ion plating method or laser ablation method, with solid carbon as raw material and under an atmosphere with a degree of vacuum of 0.05 Pa or lower, film formation of the amorphous carbon film is conducted without introducing gas which contains hydrogen or rare gas.

(14) A method for manufacturing an amorphous carbon film as described in (12) or (13), wherein the mixed layer or the mixed layer and interlayer are synthesized by applying a negative bias voltage on the base material and using an ion injection method, plasma CVD method, sputter method, cathode arc ion plating method, or laser ablation method.

(15) A method for manufacturing an amorphous carbon film as described in (12) or (13), wherein: the mixed layer or the mixed layer and interlayer are synthesized by applying a negative bias voltage on the base material and using ion injection method, plasma CVD method, sputter method, cathode arc ion plating method, or laser ablation method under an atmosphere which contains rare gas.

(16) An amorphous carbon film coated material being coated with an amorphous carbon film described in one of (1) through (11).

(17) An amorphous carbon film coated material being coated with an amorphous carbon film manufactured by a method described in one of (12) through (15).

The amorphous carbon film as described above has a high hardness, is heat-resistant, and has good adhesion. The amorphous carbon-film coated materials according to another implementation of the present invention, which are tools, dies, machine parts, electrical/electronic parts and optical parts and the like which are covered with this amorphous carbon film, have excellent wear resistance and durability. In addition to durability, if it is a tool, there is reduced cutting resistance and improved work surface precision. If it is a die, there is improved mold separation and improved smoothness of the molded surface. With machine parts, there is reduced friction resistance, reduced noise, reduced abrasion of other materials. The amorphous carbon film is manufactured by the methods (12) and (13) described above. With this method, the film is manufactured at a comparatively low temperature and can be implemented with industrial advantages for a wide range of coated materials.

BEST MODE FOR CARRYING OUT THE INVENTION

As described in (1), the amorphous carbon film according to an implementation of the present invention has a density of 2.8 g/cm$^3$ or greater and 3.3 g/cm$^3$ or less. The density of diamond is 3.529 g/cm$^3$. On the other hand, the density of amorphous carbon film is generally around 1.5 to 2.5 g/cm$^3$. The amorphous carbon film according to another implementation of the present invention has a density in an intermediate region between these. With a density of less than 2.8 g/cm$^3$, adequate heat resistance and hardness are not achieved. With a density exceeding 3.3 g/cm$^3$, synthesis at a low temperature of a few 100 degrees C. is difficult and is not realistic. From the standpoint of heat resistance, hardness, and stability of production, a density of 2.9 g/cm$^3$ or greater and 3.2 g/cm$^3$ or less is more preferred.

As described in (2), the amorphous carbon film according to another implementation of the present invention preferably has a spin density of $1\times10^{18}$ spins/cm$^3$ or greater and $1\times10^{21}$ spins/cm$^3$ or less. Spin density is a parameter corresponding to the density of unpaired electrons. The larger the spin density, the more dangling bonds or defects. The spin density of diamond is generally $1\times10^{17}$ spins/cm$^3$ or less. This indicates that for each carbon atom, there are approximately $5.7\times10^{-7}$ or less of unpaired electrons. The amorphous carbon film of the present invention preferably has a spin density of $1\times10^{18}$ spins/cm$^3$ or greater and $1\times10^{21}$ spins/cm$^3$ or less. This means that when density is 3.0 g/cm$^3$, for every one carbon atom, there is between approximately $6.7\times10^{-6}$ and $6.7\times10^{-2}$ of unpaired electrons. With smaller spin densities, hardness and heat resistance increase. However, in reality, amorphous carbon films which have a spin density of less than $1\times10^{18}$ spins/cm$^3$ are difficult to synthesize at low temperatures of a few hundred degrees C. Furthermore, amorphous carbon films with a spin density exceeding $1\times10^{21}$ spins/cm$^3$ have a large number of unpaired electrons, or in other words it has a large number of defects. Hardness is lower, and heat resistance is inferior. From the standpoint of heat resistance, hardness, production stability and the like, the spin density of the amorphous carbon film of the present invention is more preferably $1 \times 10^{19}$ spins/cm$^3$ or greater and $8 \times 10^{20}$ spins/cm$^3$ or less.

As described in (3), the amorphous carbon film according to another implementation of the present invention preferably has a carbon concentration of 99.5 at % or greater, a hydrogen concentration of 0.5 at % or less and rare gas element concentration of 0.5 at % or less. Amorphous carbon films generally contain a few at % to several tens at % of hydrogen. Because hydrogen can only have one bond, when a hydrogen bonds with a carbon atom, the continuity of bonds between carbon atoms is interrupted. Bonds between hydrogen and carbon lead to reduced hardness and reduced heat resistance of the amorphous carbon film.

In addition, when a rare gas such as argon, neon, helium, xenon, or the like is used during synthesis of an amorphous carbon film, rare gas atoms are readily incorporated into the film. Although rare gas atoms do not form bonds, they can often cause defects. The presence of defects acts to reduce hardness and reduce heat resistance. Preferably, these rare gases are not introduced into the atmosphere during synthesis of the amorphous carbon film, or they are only introduced in a small amount.

As described above, the lower the content of hydrogen and rare gas elements, the more bonds between carbon atoms. This leads to a more heat resistant film. When carbon concentration is less than 99.5 at %, defects caused by impurities increase, and hardness and heat resistance are reduced. When hydrogen concentration exceeds 0.5 at %, there are more sites where the continuity of carbon-carbon bonds is interrupted. This results in reduced hardness and heat resistance. When rare gas element concentration exceeds 0.5 at %, defects are formed, thereby lowering hardness and heat resistance.

As described above in (4), the amorphous carbon film according to another implementation of the present invention is preferably formed essentially only from carbon. In other words, the amorphous carbon film of (3) is further defined. The amorphous carbon film, comprising essentially only of carbon with hydrogen and rare gas elements detected only at the level of impurities, has extremely high stability. The level of impurities is meant as a level of unavoidable mixing. Stated more concretely, this indicates a concentration on the order of ppm. In practice, this is achieved by actively preventing the introduction of hydrogen and rare gas element or materials containing hydrogen during film formation.

The amorphous carbon film according to still another implementation of the present invention as described in (5) preferably has a Knoop hardness of 3000 or greater and 7000 or less. Amorphous carbon film generally has a reduced heat resistance when there is an increase in the graphite component. In order to have less graphite component, the Knoop hardness is preferably 3000 or greater. On the other hand, a Knoop hardness exceeding 7000 is difficult to achieve at a low temperature of a few hundred degrees C. and is not desirable. This Knoop hardness is the value when an amorphous carbon film with a film thickness of 1.0 micrometers or greater and 2.0 micrometers or less is coated onto a Si wafer and is measured with a load of 50 g or greater and 100 g or less. When film thickness is 0.4-1.0 micrometers, as a guideline, a Knoop hardness of 2000 or greater and 6000 or less is desirable. In addition, with a dynamic hardness meter which has a shallow push-in depth, measurement even with a film thickness of 0.4 micrometers or less is possible. The dynamic hardness of the present amorphous carbon film is approximately in the range of 3000 to 11000 GPa.

As described in (6), with the present amorphous carbon film, there is a mixed layer formed on the base material surface. The mixed layer has a thickness of 0.5 nm or greater and 10 nm or less and comprises the base material and at one least substance selected from the group consisting of B, Al, Ti, V, Cr, Zr, Nb, Mo, Hf, Ta, and W. An amorphous carbon layer is preferably formed on top of this layer.

An interlayer which contains base material substance has been disclosed in Japanese Laid-Open Patent Number 11-49508 for example. However, an implementation of the present invention has two characteristics—the interlayer is extremely thin with a thickness of 0.5 nm to 10 nm, and the material that is combined with the base material is not a compound such as a carbide, nitride, oxide, and the like, but is a metal material.

Because this mixed layer is so thin, although it does not function as a stress relieving layer, conversely, it does not deform due to outside forces, and fatigue failures do not occur as readily. In order to achieve this effect, the upper limit is 10 nm. In addition, with a mixed layer of less than 0.5 nm, the mixed layer is too thin, and it cannot exist as a layer. The mixed layer can be synthesized by using an ion injection method. In addition, with various PVD methods and CVD methods, film formation of the metal material can be conducted while applying a high negative bias on the substrate.

The fact that the base material is combined with a metal and not a compound is advantageous in eliminating a cause for instability during synthesis. In addition, by having the amorphous carbon layer coated on top of a layer containing a slightly active metal instead of a stable compound interlayer, there is better adhesion of the amorphous carbon layer. In order to have adhesion with carbon, B, Al, Ti, V, Cr, Zr, Nb, Mo, Hf, Ta, and W are suitable materials. Among these, Ti, V, and Cr are particularly good. When Si and Ge which are generally said to have excellent affinity with amorphous carbon layers are used with the present mixing layer, no improvements in adhesion were seen. We believe that this is due to their brittleness.

In Japanese Laid-Open Patent Number 2000-87218, there is proposed a method for forming a thin mixed layer in the form of a mixed layer of carbon film and base material or carbon film and an interlayer. However, by having the mixed layer contain carbon, graphite component is formed as described above, and good adhesion is not achieved. A characteristic according to an implementation of the present invention is that there is formed a mixed layer of metal and base material.

As described in (7), the present amorphous carbon film has an interlayer between a base material and an amorphous carbon layer. This interlayer has a thickness of 0.5 nm or greater and 10 nm or less and comprises at least one substance selected from the group consisting of B, Al, Ti, V, Cr, Zr, Nb, Mo, Hf, Ta, and W. On the base material side of the interlayer, there is preferably a mixed layer with a thickness of 0.5 nm or greater and 10 nm or less and which comprises base material and interlayer material.

The formation of a thin metal layer with no mixing on top of the mixed layer is the difference between this and the structure of previous (6). When the thickness of the interlayer is less than 0.5 nm, this is too thin and cannot exist as a layer. When the thickness exceeds 10 nm, fatigue failures occur more readily.

As described in (8), the present amorphous carbon film described in (7) preferably has a mixed layer and an interlayer with a combined thickness of 10 nm or less.

As described in (9), with the present amorphous carbon film in the methods described in (6)-(8), the mixed layer more preferably has a thickness of 0.5 nm or greater and 5 nm or less. With a thinner mixed layer, there is less likelihood of fatigue failures.

As described in (10), with the present amorphous carbon film, the mixed layer or the mixed layer and interlayer preferably has an average oxygen concentration of 1 at % or less. The mixed layer or the mixed layer and interlayer described here include the interfaces for the base material and mixed layer, the mixed layer and interlayer, the mixed layer and amorphous carbon layer, and the interlayer and amorphous carbon layer. When oxygen in this region exceeds 1 at %, the adhesion of amorphous carbon layer becomes unstable. More preferably, the average oxygen concentration is 0.5 at % or less.

The thickness and composition of the mixed layer and interlayer described above can be analyzed by TEM/TED, EDX, SIMS, AES, XPS, and the like. For example, the oxygen concentration in the mixed layer or mixed layer and interlayer can be analyzed by the following method.

First, the amorphous carbon film is polished by machine polishing or the like to a film thickness of 0.1 micrometers or less. The thinner the thickness of the amorphous carbon film, the better the precision of the analysis. While conducting etching, this area is analyzed in the depth direction using AES method. The elements that are monitored are carbon, interlayer constituting elements, mixed layer constituting elements, and base material constituting elements. With the interlayer and mixed layer, the interlayer material shows a bell-shaped distribution. From the amounts of the interlayer and mixed layer constituting elements detected in the region of this bell-shaped distribution and the amount of oxygen detected from this region, the average atomic concentration of oxygen can be obtained.

This analysis method is the same with XPS. With SIMS, this is obtained by using as a reference those which have known compositions through AES and XPS.

As described in (11), with the present amorphous carbon film described in (1)-(5), the interface of the base material and amorphous carbon layer is preferably as described in (6)-(10). In general, defects have the effect of relieving accumulated stress. However, because the amorphous carbon film of (1)-(5) have few defects, there is a high stress. As a result, separation caused by stress occurs readily. In the prior art, this is one of the reasons why amorphous carbon films with high hardness did not progress into practical use. In order to avoid this, the interface construction of (6)-(10) is used to achieve high adhesion. Amorphous carbon films of hardness 3000 or greater peeled easily in the prior art, but by using the present construction, there can be wider use in tools, dies, machine parts and the like which were difficult with the prior art.

As described in (12), with the present amorphous carbon film, film formation of the amorphous carbon film is preferably conducted by sputter method or cathode arc ion plating method or laser ablation method under an atmosphere which does not contain hydrogen and which uses solid carbon as raw material. Industrially in recent times, the synthesis of amorphous carbon film is often by plasma CVD method, ion beam vapor deposition method, sputtering method, and the like. With these methods, hydrocarbon, hydrogen, rare gas, and the like are used for the raw material and auxiliary raw material. Therefore, hydrogen and rare gas elements are easily incorporated into the film. When there is hydrogen in the atmosphere, the hydrogen bonds with carbon and enters the amorphous carbon film, reducing the density and hardness of the amorphous carbon film. The raw material is preferably not a hydrocarbon gas which contains hydrogen but is solid carbon. With regard to rare gas, the amount introduced is small, and synthesis is conducted under low pressure. This is advantageous for achieving an amorphous carbon film with high density and few defects and with a high hardness.

As described in (13), with the present amorphous carbon film, film formation of the amorphous carbon film is more preferably conducted by cathode arc ion plating method or laser ablation method with solid carbon as raw material, under an atmosphere having a degree of vacuum of 0.05 Pa or less, and without introducing a gas which contains hydrogen or rare gas. With these methods, because synthesis of the amorphous carbon film is conducted without introducing gas into the atmosphere, a high hardness amorphous carbon film with higher density and with fewer defects is synthesized. If the atmosphere is greater than 0.05 Pa, components such as water and the like contained in the residual gas become incorporated into the film.

As described in (14), with the present amorphous carbon film, the mixed layer or the mixed layer and interlayer are synthesized by ion injection method, plasma CVD method, sputter method, cathode arc ion plating method, laser ablation method while applying a negative bias on the base material. With plasma CVD method, the metal element used in the mixed layer or mixed layer and interlayer is supplied by a metal compound gas. With sputter method, cathode arc ion plating method, and laser ablation method, the metal element is supplied from a solid vaporization source. By applying a negative bias on the base material, the mixed layer is formed. With the ion injection method, an ion source is generated, and by having the accelerated metal ions injected onto the base material surface, the mixed layer is formed.

As described in (15), with the present amorphous carbon film, synthesis of the mixed layer or the mixed layer and interlayer are preferably synthesized by ion injection method, plasma CVD method, sputter method, cathode arc ion plating method, or laser ablation method, under a rare gas atmosphere, and while applying a negative bias to the base material. By having a rare gas atmosphere, the formation of the mixed layer is accelerated.

As described in (16) and (17), with the present amorphous carbon film, parts coated with the amorphous carbon film described in one of (1)-(11) and parts coated with the amorphous carbon film manufactured by one of the methods described in (12)-(15) have a high hardness and excellent heat resistance. Stated more concretely, they can be used for tools, various dies, machine parts, and electrical/electronic parts.

EMBODIMENTS

Embodiment 1

Amorphous carbon film was coated onto Si substrates by various methods. The following measurements were taken: density, spin density, carbon/hydrogen/rare gas element concentrations, Knoop hardness, and temperature at which hardness began to decline.

The film formation methods used were plasma CVD method, laser ablation method, cathode arc ion plating method, filament CVD method, microwave CVD method, ion beam vapor deposition method, and anti-parallel magnetron sputter method.

With the plasma CVD method, acetylene gas was used as the raw material. Acetylene gas was introduced into the atmosphere, and a high frequency of 13.56 MHz was applied to the substrate to form an amorphous carbon film.

With the laser ablation method, a carbon target was used for the raw material. The target was irradiated by a laser, and with its energy, the carbon at the surface vaporized and became plasma, and a film was formed on the substrate on which a negative voltage was applied.

With the cathode arc ion plating method, a carbon target was used for the raw material. Negative voltage was applied to the target to produce arc discharge. With this energy, carbon was vaporized and made into plasma, and a film was formed on the substrate on which negative voltage was applied.

With the filament CVD method, 1% methane and 99% hydrogen were used for the raw materials. With a W filament, methane and hydrogen were broken down, and a diamond film was precipitated on the substrate.

With the microwave CVD method, 1% methane and 99% hydrogen were used for the raw materials. Methane and hydrogen were broken down with a microwave of 2.45 GHz, and a diamond film was precipitated on the substrate.

With the ion beam vapor deposition method, benzene gas was used for the raw material. The ionized benzene ions were accelerated and irradiated onto the substrate to precipitate an amorphous carbon film.

With the anti-parallel magnetron sputtering method, a carbon target as described above was used for the raw material. Argon gas was introduced into the atmosphere. A negative direct current voltage was applied to the target to produce a discharge. Carbon ions which were sputtered from the target surface and activated in the plasma were irradiated onto a substrate on which negative voltage was applied, and an amorphous carbon film was formed.

The physical properties of the amorphous carbon film were measured by the following method.

The density was derived from changes in weight of the base material before and after film formation and from film thickness. The spin density was derived by the ESR method. The concentrations for carbon/hydrogen/rare gas element were measured using SIMS, HFS, and RBS. Knoop hardness measurements were conducted with a load of 50 g or 100 g. The start temperature at which hardness starts to decline was measured by heating in an electric furnace in atmospheric air and maintaining it at a set temperature for 1 hour, and then cooling to room temperature. The start temperature was the temperature at which a hardness reduction of 20% or greater was seen.

The results are shown in Tables 1, 2, and 3.

TABLE 1

|   | | Density ($g/cm^3$) | Temperature at which hardness starts to decline (degrees C.) | Knoop Hardness | Manufacturing Method | Synthesis Temperature (degrees C.) |
|---|---|---|---|---|---|---|
| Comparative Example | 1.1 | 2.28 | 380 | 1400 | Plasma CVD method | 200 |
| Embodiment | 1.1 | 2.85 | 490 | 2200 | Laser ablation method | 180 |
| Embodiment | 1.2 | 3.09 | 530 | 3900 | Cathode arc ion plating method | 220 |
| Comparative Example | 1.2 | 3.5 | 600 or greater | Measurement not possible | Filament CVD method | 1100 |

TABLE 2

|   | | Spin Density ($spins/cm^3$) | Temperature at which hardness starts to decline (degrees C.) | Knoop Hardness | Manufacturing Method | Synthesis Temperature (degrees C.) |
|---|---|---|---|---|---|---|
| Comparative Example | 1.3 | 2.5E+16 | 600 or greater | Measurement not possible | Microwave CVD method | 950 |
| Embodiment | 1.3 | 5.0E+19 | 560 | 4500 | Cathode arc ion plating method | 190 |
| Embodiment | 1.4 | 7.9E+20 | 520 | 3800 | Laser ablation method | 230 |
| Comparative Example | 1.4 | 6.0E+21 | 410 | 1600 | Ion beam vapor deposition method | 220 |

TABLE 3

|   | | Carbon Concentration | Hydrogen Concentration | Rare Gas Concentration | Temperature at which hardness starts to decline (degrees C.) | Knoop Hardness | Manufacturing Method | Synthesis Temperature (degrees C.) |
|---|---|---|---|---|---|---|---|---|
| Comparative Example | 1.5 | 68 at % | 31 at % | Less than 0.5 at % | 370 | 1200 | Plasma CVD Method | 220 |
| Embodiment | 1.5 | 99.5 at % or greater | 0.5 at % | Less than 0.5 at % | 480 | 2600 | Anti parallel magnetron sputtering method | 200 |
| Embodiment | 1.6 | 99.5 at % or greater | Less than 0.5 at % | Less than 0.5 at % | 510 | 3600 | Cathode arc ion plating method | 180 |
| Embodiment | 1.7 | 99.5 at % or greater | 800 ppm | Less than 5 ppm | 580 | 4900 | Laser ablation method | 220 |
| Embodiment | 1.8 | 99.5 at % or greater | Less than 5 ppm | 50 ppm | 580 | 5100 | Laser ablation method | 180 |

TABLE 3-continued

| | | Carbon Concentration | Hydrogen Concentration | Rare Gas Concentration | Temperature at which hardness starts to decline (degrees C.) | Knoop Hardness | Manufacturing Method | Synthesis Temperature (degrees C.) |
|---|---|---|---|---|---|---|---|---|
| Embodiment | 1.9 | 99.5 at % or greater | Less than 5 ppm | Less than 5 ppm | 580 | 5300 | Cathode arc ion plating method | 230 |

It can be seen that with higher density (Table 1), with smaller spin density (Table 2), and higher carbon concentration and smaller hydrogen and rare gas element concentrations (Table 3), the higher the hardness and heat resistance.

Embodiment 2

An amorphous carbon film was coated onto a cemented carbide plate by plasma CVD method, laser ablation method, cathode arc ion plating method, and anti-parallel sputtering method.

With the resulting amorphous carbon film, a comparison test of wear amount was implemented with a pin on disc type of friction and wear tester. For the pin, SUJ2 with a tip diameter of R3 mm was used, and for the disc, cemented carbide coated with the amorphous carbon film was used. The load was 10 N, and rotation speed was 100 mm/sec. The testing was conducted at room temperature under atmospheric air. The wear amount of the disc was compared as relative values.

In addition, a durability test was implemented with a ring on plate type of friction and wear tester. For the opposing ring, SUJ2 with an outer diameter of 50 mm was used. For the plate, cemented carbide coated with amorphous carbon film was used. The ring and plate were placed so that a point on the outer perimeter of the ring was always at the same place on the plate, and the test was conducted by rotating the ring. The load was 50 N, and rotation speed was 3000 mm/sec. The temperature was the temperature of the frictional heat, and the atmosphere was atmospheric air. The friction resistance was monitored, and the time point when there was a large change in the resistance value was determined to be the time when there was no more film. The life spans were compared as relative values.

Furthermore, using a test piece from the same lot, the following measurements were taken: density, spin density, concentrations of various elements, and Knoop hardness.

These results are organized in Table 4.

With higher density, smaller spin density, higher concentration of carbon and lower concentration of hydrogen and rare gas, and higher hardness, wear resistance was higher and durability was excellent.

Embodiment 3

Using cathode arc ion plating method, amorphous carbon film was coated onto a cemented carbide drill. The amorphous carbon film coating had a density of 3.11 g/cm$^3$, a spin density of $2.0 \times 10^{20}$ spins/cm$^3$, a carbon concentration of 99.9 at % or greater, hydrogen/rare gas concentrations that were undetectable by HFS/RBS, and a Knoop hardness of 3800.

Similarly, coating with amorphous carbon film was conducted with plasma CVD method. This coating had a density of 2.05 g/cm$^3$, a spin density of $2.5 \times 10^{21}$ spins/cm$^3$, a carbon concentration of 71 at %, a hydrogen concentration of 27 at %, a rare gas element concentration of 0.5 at % or less, and a Knoop hardness of 1500.

These drills were used for making dry holes in an aluminum alloy containing 15% Si. With the former, no abnormalities were seen even after using for a length of time that was 10 times the life span of the uncoated drill. On the other hand, with the latter, at a time of 1.5 times the lifespan of the uncoated drill, the film was mostly gone.

Embodiment 4

The same two types of coatings as in Embodiment 3 were coated onto a molding surface of an injection molding die of a magnesium alloy made of SKD11, and injection molding was conducted.

With the uncoated die, a mold releasing agent must be applied every time, or else the magnesium alloy sticks. With the die coated with the amorphous carbon film by the CVD method, molding could be conducted a few times without a mold releasing agent, however after 10 moldings, the coating was gone, and sticking occurred. When the die was coated with an amorphous carbon film by the cathode arc ion plating

TABLE 4

| | | Film Formation Method | Density (g/cm$^3$) | Spin Density (spins/cm$^3$) | Carbon Concentration | Hydrogen Concentration | Rare Gas Concentration | Knoop Hardness | Pin on Disk Test Wear Amount | Ring on Plate Test Durability |
|---|---|---|---|---|---|---|---|---|---|---|
| Comparative Example | 2.1 | Plasma CVD Method | 1.70 | 5.0E+21 | 64 | 33 | 0.5 at % | 1200 | 1 | 1 |
| Embodiment | 2.1 | Anti parallel Sputter Method | 2.80 | 1.0E+21 | 99.5 or greater | Less than 0.5 at % | Less than 0.5 at % | 2600 | 0.5 | 3.2 |
| Embodiment | 2.2 | Cathode arc ion plating method | 2.90 | 9.0E+20 | 99.5 or greater | 500 ppm | 300 ppm | 2800 | 0.25 | 6.8 |
| Embodiment | 2.3 | Laser ablation method | 3.05 | 7.6E+20 | 99.5 or greater | Less than 5 ppm | Less than 5 ppm | 3900 | 0.1 or less | 10 or greater |
| Embodiment | 2.4 | Cathode arc ion plating method | 3.25 | 8.0E+18 | 99.5 or greater | Less than 5 ppm | Less than 5 ppm | 5200 | 0.1 or less | 10 or greater | method, even after 1000 moldings, the coating remained and good molding properties were seen.

Embodiment 5

The same two types of coatings as in Embodiment 3 were coated onto a piston ring of an automobile engine. This was built into an engine of an actual car, and running tests were conducted to examine durability. With the piston ring coated with amorphous carbon film by the plasma CVD method, the amorphous carbon film was completely gone by one hour of the running test. On the other hand, with the piston ring coated with amorphous carbon film by the cathode arc ion plating method, no abnormalities were seen even after 500 hours of the running test.

Embodiment 6

Film formation of amorphous carbon film was conducted by the cathode arc ion plating method and laser ablation method while changing the atmosphere during film formation.

Amorphous carbon film was formed by cathode arc ion plating method with a degree of vacuum of 0.001 Pa and without introducing gas. This amorphous carbon film had a density of 3.05 g/cm$^3$, a spin density of $4 \times 10^{20}$ spins/cm$^3$, a carbon concentration of 99.5 at % or greater, hydrogen concentration and rare gas element concentration of 5 ppm or less, and a Knoop hardness of 4500. Amorphous carbon film formed while introducing 10 mTorr of argon had a density of 2.44 g/cm$^3$, a spin density of $3 \times 10^{21}$ spins/cm$^3$, carbon concentration of 99.5 at % or greater, rare gas element concentration of 0.5 at % or less, and a Knoop hardness of 1800. These films were used to coat Al alloy drills, and after examining their life spans, the former had a life span over 5 times that of the latter.

Similarly, an amorphous carbon film was formed by the laser ablation method with a degree of vacuum of 0.003 Pa and without introducing gas. This amorphous carbon film had a density of 3.13 g/cm$^3$, a spin density of $6.2 \times 10^{20}$ spins/cm$^3$, carbon concentration of 99.5 at % or greater, hydrogen concentration and rare gas element concentration of 5 ppm or less, and a Knoop hardness of 3800. An amorphous carbon film formed while introducing 10 mTorr of hydrogen gas had a density of 2.20 g/cm$^3$, a spin density of $2 \times 10^{21}$ spins/cm$^3$, carbon concentration of 94 at %, hydrogen concentration of 6 at %, and a Knoop hardness of 1600. When these coatings were used for an injection molding die of a magnesium alloy, the former had 15 times the life span of the latter.

Embodiment 7

Amorphous carbon films were coated onto substrates of tool steel, stainless steel, cemented carbide, alumina, sapphire, glass, and silicon nitride via mixed layers of various metals and the substrate material. The film thickness of the amorphous carbon film was approximately 1 micrometer.

B and Al were synthesized by the anti-parallel magnetron sputtering method; Ti, V, and Cr were synthesized by the cathode arc ion plating method; Zr, Nb, and Mo were synthesized by the ion injection method; and Hf, Ta, and W were synthesized by the laser ablation method.

In the anti-parallel magnetron sputtering method, a metal target described above was used as the raw material. Argon gas was introduced into the atmosphere, and a negative direct current voltage was applied to the target to produce a discharge. Metal ions which were sputtered from the target surface and activated in the plasma were irradiated onto the substrate on which negative voltage was applied, and a mixed layer was formed.

With the cathode arc ion plating method, a metal target described above was used as the raw material. Negative voltage was applied onto the target to produce an arc discharge. With this energy, metal was vaporized and made into plasma and was irradiated onto the substrate on which negative voltage was applied, and a mixed layer was formed.

With the ion injection method, metal ions described above from an ion source were irradiated onto the substrate, and a mixed layer was formed.

With the laser ablation method, a metal target described above was used as the raw material. The target was irradiated by a laser, and with this energy, the metal at the surface was vaporized and made into plasma, and a film was formed on the substrate on which negative voltage was applied.

For the mixed layer formed by the ion injection method, an amorphous carbon layer was formed on top of this mixed layer by magnetron sputtering method. For all other mixed layers, the amorphous carbon layers were formed by the same method as the mixed layer.

In the magnetron sputtering method, a carbon target was used as the raw material. Argon gas or a mixture gas of argon and methane was introduced into the atmosphere. A negative direct current voltage was applied to the target to produce discharge. The carbon ions, which were sputtered from the target surface and activated in the plasma, together with the carbon ions and hydrocarbon ions in the plasma atmosphere reacted on top of the substrate to form an amorphous carbon film.

With regard to the resulting amorphous carbon film, a sliding test was conducted with a pin on disk type of friction and wear tester, and the time to peeling of the film was examined. The same test was conducted for one in which there was no mixed layer and the amorphous carbon film was coated onto the substrate via a Mo interlayer of thickness 10 nm. The ratios of the time to peeling of the amorphous carbon film provided with a mixed layer to that of the amorphous carbon film with a Mo interlayer are organized in Table 5.

TABLE 5

| | | | Mixed Layer | | Relative Ratio of the Time to Peeling |
|---|---|---|---|---|---|
| | | Substrate | Metal Material | Thickness (nm) | with Respect to that with No Mixed Layer |
| Embodiment | 1 | Tool Steel SKH51 | B | 2.0 | 3.1 |
| Embodiment | 2 | Tool Steel SKD11 | Al | 2.5 | 2.1 |
| Embodiment | 3 | Cemented Carbide | Ti | 1.0 | 2.7 |
| Embodiment | 4 | Cemented Carbide | V | 2.0 | 3.5 |

TABLE 5-continued

|  |  | Substrate | Mixed Layer | | Relative Ratio of the Time to Peeling with Respect to that with No Mixed Layer |
|---|---|---|---|---|---|
|  |  |  | Metal Material | Thickness (nm) |  |
| Embodiment | 5 | Alumina | Cr | 2.5 | 4.2 |
| Embodiment | 6 | Alumina | Zr | 3.0 | 3.8 |
| Embodiment | 7 | Sapphire | Nb | 2.5 | 3.1 |
| Embodiment | 8 | Sapphire | Mo | 3.5 | 2.7 |
| Embodiment | 9 | Glass | Hf | 2.0 | 4.0 |
| Embodiment | 10 | Glass | Ta | 3.0 | 3.1 |
| Embodiment | 11 | Silicone Nitride | W | 2.5 | 2.9 |
| Comparative Example | 1 | Tool Steel SKD11 | Ti | 0.2 | 1.5 |
| Embodiment | 12 | Tool Steel SKD11 | V | 0.8 | 2.9 |
| Embodiment | 13 | Tool Steel SKH51 | Cr | 2.5 | 3.5 |
| Embodiment | 14 | Tool Steel SKH51 | Ti | 5.0 | 4.7 |
| Embodiment | 15 | Stainless Steel SUS304 | V | 7.5 | 4.0 |
| Comparative Example | 2 | Cemented Carbide | Cr | 13.0 | 1.8 |

This shows that having a mixed layer increased durability several-fold, and the adhesion was greatly improved.

Embodiment 8

The various machinery as in Embodiment 7 was coated with an amorphous carbon layer via a mixed layer of metal and the substrate material and a metal interlayer. The film thickness of the amorphous carbon film was approximately 0.8 micrometers.

B and Al were synthesized by a laser ablation method; Ti, Zr, and Hf were synthesized by an anti-parallel magnetron sputtering method; V, Nb, and Ta were synthesized by an ion injection method; and Cr, Mo, and W were synthesized by a cathode arc ion plating method.

For the mixed layer formed by the ion injection method, an amorphous carbon film was formed by magnetron sputtering method. For all other mixed layers, the amorphous carbon films were formed by the same method as the mixed layer. The film formation methods are the same as in Embodiment 7.

With regard to the resulting amorphous carbon film, a sliding test was conducted with a ring on plate type of friction and wear tester, and the time to peeling of the film was examined. The same test was conducted for one in which there was no mixed layer and interlayer and instead the amorphous carbon layer was coated onto the substrate via a titanium carbide interlayer of thickness 10 nm. The ratio of the time to peeling for the amorphous carbon film provided with a mixed layer and interlayer to that of the amorphous carbon film with a titanium carbide interlayer are organized in Table 6.

TABLE 6

|  |  | Substrate | Mixed Layer | | Interlayer | | Total Thickness of Mixed Layer + Interlayer | Relative Ratio of the Time to Peeling with Respect to that with no Mixed Layer + Interlayer |
|---|---|---|---|---|---|---|---|---|
|  |  |  | Metal Material | Thickness (nm) | Metal Material | Thickness (nm) |  |  |
| Embodiment | 1 | Alumina | B | 2.0 | B | 2.5 | 4.5 | 2.1 |
| Embodiment | 2 | Alumina | Al | 2.5 | Al | 3.0 | 5.5 | 2.2 |
| Embodiment | 3 | Glass | Ti | 1.5 | Ti | 2.5 | 4.0 | 3.8 |
| Embodiment | 4 | Silicon Nitride | V | 3.0 | V | 5.5 | 8.5 | 3.7 |
| Embodiment | 5 | Tool Steel SKH51 | Cr | 3.5 | Cr | 2.5 | 6.0 | 3.9 |
| Embodiment | 6 | Tool Steel SKD11 | Zr | 2.0 | Zr | 5.5 | 7.5 | 3.3 |
| Embodiment | 7 | Tool Steel SKD11 | Nb | 4.5 | Nb | 4.5 | 9.0 | 3.6 |
| Embodiment | 8 | Stainless Steel SUS304 | Mo | 1.5 | Mo | 2.5 | 4.0 | 2.9 |
| Embodiment | 9 | Stainless Steel SUS304 | Hf | 3.0 | Hf | 2.0 | 5.0 | 3.1 |
| Embodiment | 10 | Cemented Carbide | Ta | 0.8 | Ta | 1.7 | 2.5 | 3.0 |
| Embodiment | 11 | Cemented Carbide | W | 1.0 | W | 3.0 | 4.0 | 2.3 |
| Comparative Example | 1 | Stainless Steel SUS 304 | Ti | 0.2 | Ti | 0.2 | 0.4 | 1.9 |
| Embodiment | 12 | Cemented Carbide | V | 0.6 | V | 0.9 | 1.5 | 3.0 |
| Embodiment | 13 | Tool Steel SKD11 | Cr | 2.0 | Cr | 2.5 | 4.5 | 4.2 |
| Embodiment | 14 | Tool Steel SKD11 | Ti | 4.0 | Ti | 5.0 | 9.0 | 4.6 |
| Embodiment | 15 | Tool Steel SKH51 | V | 8.5 | V | 7.0 | 15.5 | 3.8 |
| Comparative Example | 2 | Tool Steel SKH51 | Cr | 8.5 | Cr | 14.0 | 22.5 | 1.8 |

This shows that having a mixed layer and interlayer increased durability several-fold, and the adhesion was greatly improved.

Embodiment 9

An amorphous carbon film was coated onto a tool steel substrate via a Ti mixed layer. An amorphous carbon film of film thickness approximately 1.5 micrometers was coated onto a stainless steel substrate via a Cr mixed layer and interlayer.

With both, the mixed layer, interlayer, and amorphous carbon layer were all synthesized by a cathode arc ion plating method.

The oxygen concentration contained in the mixed layer and the interlayer was adjusted by changing the vacuum pulling time or by allowing small amounts of oxygen gas during film formation.

With regard to the resulting coating, the peeling load was measured by a scratch test. The results are shown in Table 7.

The lower the oxygen concentration, the higher the peeling load.

Embodiment 10

Amorphous carbon films of various hardnesses were coated onto a tool steel substrate at a film thickness of 1.5 micrometers. Ones which have a 2 nm Cr mixed layer and 2 nm Cr interlayer and ones with a 2 nm Si mixed layer and 2 nm Si interlayer were created.

TABLE 7

| | Substrate | Mixed Layer Metal Material | Mixed Layer Thickness (nm) | Interlayer Metal Material | Interlayer Thickness (nm) | Average Oxygen Concentration of Mixed Layer and InterLayer | Scratch Test Peeling Loan (N) |
|---|---|---|---|---|---|---|---|
| Embodiment 1 | SKD11 | Ti | 2.5 | — | — | 6.5 | Peeling with time |
| Embodiment 2 | SKD12 | Ti | 2.5 | — | — | 2.5 | 11 |
| Embodiment 3 | SKD13 | Ti | 2.5 | — | — | 1.0 | 45 |
| Embodiment 4 | SKD14 | Ti | 2.0 | — | — | 0.5 or less | 68 |
| Embodiment 5 | SUS304 | Cr | 3.5 | Cr | 2.0 | 5.5 | 2 |
| Embodiment 6 | SUS305 | Cr | 4.0 | Cr | 3.5 | 3.0 | 6 |
| Embodiment 7 | SUS306 | Cr | 2.0 | Cr | 2.5 | 0.8 | 21 |
| Embodiment 8 | SUS307 | Cr | 2.5 | Cr | 2.0 | 0.5 or less | 28 |

The appearances of these after film formation are indicated in Table 8.

TABLE 8

| | | | Outer Appearance | |
|---|---|---|---|---|
| | Substrate | Carbon Film Knoop Hardness | Si Mixed Layer and Interlayer | Cr Mixed Layer and Interlayer |
| Embodiment 1 | Tool Steel SKH51 | 900 | Good | Good |
| Embodiment 2 | Tool Steel SKH51 | 1200 | Good | Good |
| Embodiment 3 | Tool Steel SKH51 | 2100 | Good | Good |
| Embodiment 4 | Tool Steel SKH51 | 3100 | Peeling with Time | Good |
| Embodiment 5 | Tool Steel SKH51 | 4300 | Peeling immediately after film formation | Good |
| Embodiment 6 | Tool Steel SKH51 | 5200 | Peeling immediately after film formation | Good |
| Embodiment 7 | Tool Steel SKH51 | 6500 | Peeling immediately after film formation | Good |
| Embodiment 8 | Tool Steel SKH51 | 8000 | Peeling immediately after film formation | Good |

Those with a Si mixed layer and Si interlayer had peeling when hardness was 2800 or greater. The appearance of those with a Cr mixed layer and Cr interlayer was good for all hardness.

INDUSTRIAL APPLICABILITY

As described above, the amorphous carbon film according to an embodiment of the present invention is highly adhesive and has excellent wear resistance and durability. By using the present invention, the durability of tools, dies, machine parts, and the like is dramatically heightened. At the same time, for tools, the cutting resistance is reduced, and there should be improved precision of the processing surface. For dies, there is improved mold separation, and a smooth molding surface can be realized. For machine parts, reduction in frictional resistance, reduction in noise, and reduction in abrasion of opposing parts is possible.

The invention claimed is:

1. An amorphous carbon film, comprising:
   an amorphous carbon layer; and
   an interlayer disposed between a base material and the amorphous carbon layer, said interlayer containing at least one substance selected from the group consisting of B, Al, Ti, V, Cr, Zr, Nb, Mo, Hf, Ta, and W, and said interlayer having a thickness of 0.5 nm or greater 10 nm or less;
   wherein on a base material side of said interlayer, there is a mixed layer which contains portions of the base material and the interlayer material and which has a thickness of 0.5 nm or greater and 10 nm or less,
   wherein an average oxygen concentration contained in said mixed layer or in said mixed layer and intertayer is 1 at % or less,
   wherein a concentration of carbon in the amorphous carbon layer is 99.5 at % or greater, a concentration of hydrogen in the amorphous carbon layer is 0.5 at % or less, a concentration of a rare gas element in the amorphous carbon layer is 0.5 at % or less, and
   wherein the amorphous carbon film is formed by:
   executing a cathode arc ion plating method, with solid carbon as raw material and under an atmosphere with a degree of vacuum of 0.05 Pa or lower.

2. An amorphous carbon film as described in claim 1, wherein: said mixed layer and said interlayer have a combined thickness of 10 nm or less.

3. An amorphous carbon film according to any one of claims 1 and 2, wherein said amorphous carbon layer has a density of 2.8 $g/m^3$ or greater and 3.3 $g/cm^3$ or less.

4. An amorphous carbon film according to any one of claims 1 and 2, said amorphous carbon layer has a spin density of $1\times10^{18}$ spins/$cm^3$ or greater and $1\times10^{21}$ spins/$cm^3$ or less.

5. An amorphous carbon film according to any one of claims 1 and 2, wherein said amorphous carbon layer is essentially formed from carbon.

6. An amorphous carbon film according to any one of claims 1 and 2, wherein Knoop hardness is 3000 or greater 7000 or less.

7. A method for manufacturing an amorphous carbon film according to any one of claims 1 and 2, wherein said executing step further includes the step of:
   forming an amorphous carbon layer without introducing gas which contains hydrogen or rare gas.

8. An amorphous carbon film according to any one of claims 1 and 2, wherein the amorphous carbon film is further formed by:
   synthesizing said mixed layer by applying a negative bias voltage on said base material.

9. An amorphous carbon film according to an one of claims 1 and 2, wherein the amorphous carbon film is further formed by:
   synthesizing said mixed layer by applying a negative bias voltage on said base material and using said cathode are ion plating method under an atmosphere which contains rare gas.

10. An amorphous carbon film coated material, comprising:
    a material being coated with an amorphous carbon film according to any one of claims 1 and 2.

11. An amorphous carbon film according to any one of claims 1 and 2, wherein a thickness of said mixed layer is 0.5 nm or greater 5 nm or less.

* * * * *

UNITED STATES PATENT AND TRADEMARK OFFICE
CERTIFICATE OF CORRECTION

PATENT NO. : 7,416,786 B2  
APPLICATION NO. : 10/539649  
DATED : August 26, 2008  
INVENTOR(S) : Kazuhiko Oda et al.

It is certified that error appears in the above-identified patent and that said Letters Patent is hereby corrected as shown below:

In Claim 9, column 22, line 27, Delete "an one of" and insert --any one of--, therefor.

Signed and Sealed this

Sixth Day of January, 2009

JON W. DUDAS  
*Director of the United States Patent and Trademark Office*